United States Patent
Shin et al.

(10) Patent No.: US 9,595,361 B2
(45) Date of Patent: Mar. 14, 2017

(54) THIN FILM STRUCTURE INCLUDING METAL SEED LAYER AND METHOD OF FORMING OXIDE THIN FILM ON TRANSPARENT CONDUCTIVE SUBSTRATE BY USING THE METAL SEED LAYER

(71) Applicant: Samsung Electronics Co., Ltd., Suwon-Si, Gyeonggi-Do (KR)

(72) Inventors: Hyeon-jin Shin, Suwon-si (KR); Seong-jun Park, Seoul (KR); Jae-ho Lee, Seoul (KR); Seong-Jun Jeong, Ulsan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/337,741

(22) Filed: Jul. 22, 2014

(65) Prior Publication Data

US 2015/0194234 A1    Jul. 9, 2015

(30) Foreign Application Priority Data

Jan. 3, 2014    (KR) ........................ 10-2014-0000837

(51) Int. Cl.
| | | |
|---|---|---|
| *H01L 21/30* | (2006.01) | |
| *H01L 21/46* | (2006.01) | |
| *H01B 1/08* | (2006.01) | |
| *C23C 14/08* | (2006.01) | |
| *C23C 14/02* | (2006.01) | |
| *C23C 16/02* | (2006.01) | |
| *C23C 16/40* | (2006.01) | |

(52) U.S. Cl.
CPC ............. *H01B 1/08* (2013.01); *C23C 14/025* (2013.01); *C23C 14/08* (2013.01); *C23C 16/0281* (2013.01); *C23C 16/40* (2013.01); *Y10T 428/265* (2015.01)

(58) Field of Classification Search
CPC .......... H01L 21/76251; H01L 29/7869; H01L 29/861; H01L 21/02554; H01L 21/02565; C23C 14/025; C23C 14/08; C23C 16/0281; C23C 16/40; C23C 18/1216; H01B 1/08
USPC .................... 257/43; 438/455, 459
See application file for complete search history.

(56) References Cited

U.S. PATENT DOCUMENTS

| | | | | |
|---|---|---|---|---|
| 5,563,000 | A | * 10/1996 | Hatwar | ..................... G11B 5/66 360/135 |
| 6,221,520 | B1 | * 4/2001 | Takaki | .................. C23C 14/086 359/360 |
| 6,420,032 | B1 | * 7/2002 | Iacovangelo | ........... C03C 17/36 428/412 |
| 7,589,464 | B2 | 9/2009 | Conley, Jr. et al. | |
| 8,354,336 | B2 | 1/2013 | Afzali-Ardakani et al. | |

(Continued)

FOREIGN PATENT DOCUMENTS

KR    20120126245 A    11/2012

*Primary Examiner* — Duy T Nguyen
(74) *Attorney, Agent, or Firm* — Harness, Dickey & Pierce, P.L.C.

(57) ABSTRACT

A thin film structure includes a metal seed layer, and a method of forming an oxide thin film on a conductive substrate by using the metal seed layer is disclosed. The thin film structure includes a transparent conductive substrate, a metal seed layer that is deposited on the transparent conductive substrate, and a metal oxide layer that is deposited on the metal seed layer.

13 Claims, 7 Drawing Sheets

(56) References Cited

U.S. PATENT DOCUMENTS

| | | | |
|---|---|---|---|
| 2009/0126791 A1* | 5/2009 | Lu | B32B 17/10036 |
| | | | 136/258 |
| 2010/0051903 A1* | 3/2010 | Cho | H01B 1/08 |
| | | | 257/14 |
| 2011/0221061 A1 | 9/2011 | Prakash et al. | |
| 2013/0157070 A1* | 6/2013 | Fujino | H01B 7/04 |
| | | | 428/469 |

* cited by examiner

THIN FILM STRUCTURE INCLUDING METAL SEED LAYER AND METHOD OF FORMING OXIDE THIN FILM ON TRANSPARENT CONDUCTIVE SUBSTRATE BY USING THE METAL SEED LAYER

RELATED APPLICATIONS

This application claims priority from Korean Patent Application No. 10-2014-0000837, filed on Jan. 3, 2014, in the Korean Intellectual Property Office, the disclosure of which is incorporated herein in its entirety by reference.

BACKGROUND

1. Field

At least one example embodiment relates to thin film structures including a metal seed layer and/or methods of forming an oxide thin film on a transparent conductive substrate by using the metal seed layer.

2. Description of the Related Art

In general, a transparent device uses, as an electrode, a conductive thin film formed of a transparent conductive inorganic material, such as indium tin oxide (ITO). In order to manufacture a logic device such as a transistor by using a transparent conductive thin film, an oxide film is typically formed on the transparent conductive thin film. However, it is generally difficult to form the oxide film having characteristics that are required by the logic device on a surface of the transparent conductive thin film such as an ITO thin film. For example, when an oxide film is deposited on a surface of an ITO thin film by using atomic layer deposition (ALD), it is difficult to apply the oxide film that is deposited on the surface of the ITO thin film to a logic device because the oxide film has a low breakdown voltage.

SUMMARY

At least one example embodiment relates to thin film structures including a metal seed layer, and/or methods of forming an oxide thin film on a transparent conductive substrate by using the metal seed layer.

Additional example embodiments will be set forth in part in the description which follows and, in part, will be apparent from the description, or may be learned by practice of the example embodiments.

According to at least one example embodiment, a thin film structure includes a substrate that includes a transparent conductive material, a metal seed layer that is deposited on the substrate, and a metal oxide layer that is deposited on the metal seed layer.

The substrate may include indium tin oxide (ITO), indium zinc oxide (IZO), antimony tin oxide (ATO), aluminum (Al)-doped zinc oxide (AZO), or zinc tin oxide (ZTO).

The metal seed layer may include at least one of aluminum (Al), titanium (Ti), chromium (Cr), iron (Fe), cobalt (Co), nickel (Ni), copper (Cu), zinc (Zn), palladium (Pd), platinum (Pt), gold (Au), and silver (Ag). A thickness of the metal seed layer may be equal to or less than 5 nm.

The metal oxide layer may include $B_2O_3$, $B_xP_yO_z$, $Al_2O_3$, $Al_xSi_yO_z$, $Al_xCr_yO_z$, $SiO_2$, $Si_xAl_yO_z$, $Si_xTi_yO_z$, $PO_x$, $TiO_2$, $Ti_xSi_yO_z$, $VO_x$, $CrO_x$, $Cr_xAl_yO_z$, $FeO_x$, $ZnO$, $GeO_2$, $SnO_2$, $Ta_2O_5$, $CoO_x$, $CuO$, $NiO$, $Ga_2O_3$, $SrO$, $Y_2O_3$, $ZrO_2$, $Zr_xAl_yO_z$, $Zr_xTi_yO_z$, $Nb_2O_5$, $RuO$, $In_2O_3$, $Sb_2O_4$, $La_2O_3$, $CeO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, $HfO_2$, $Hf_xAl_yO_z$, $Hf_xSi_yO_z$, $Hf_xTi_yO_z$, $WO_3$, or $BiO_x$.

According to at least one example embodiment, a method of forming an oxide thin film includes preparing a substrate that includes a transparent conductive inorganic material, depositing a metal seed layer on the substrate, and depositing a metal oxide layer on the metal seed layer.

The metal seed layer may be formed to a thickness that is equal to or less than 5 nm. The metal seed layer may be deposited by using physical vapor deposition (PVD), chemical vapor deposition (CVD), or atomic layer deposition (ALD).

The metal oxide layer may be deposited by using ALD. The metal oxide layer may be formed to a thickness that is equal to or less than tens of nm. The metal oxide layer may be formed at a temperature ranging from about 15° C. to about 1500° C.

The metal oxide layer may be formed by using PVD or CVD.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

At least one example embodiment will be described more fully with reference to the accompanying drawings, in which example embodiments are shown. The example embodiments may, however, be embodied in many different forms and should not be construed as being limited to the examples set forth herein; rather these example embodiments are provided so that this disclosure will be thorough and complete, and will fully convey the inventive concepts to one of ordinary skill in the art. In the drawings, like reference numerals denote like elements, and sizes or thicknesses of elements may be exaggerated for clarity. A material of each layer in the following embodiments is an example, and thus other materials may be used. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Figure 1A:
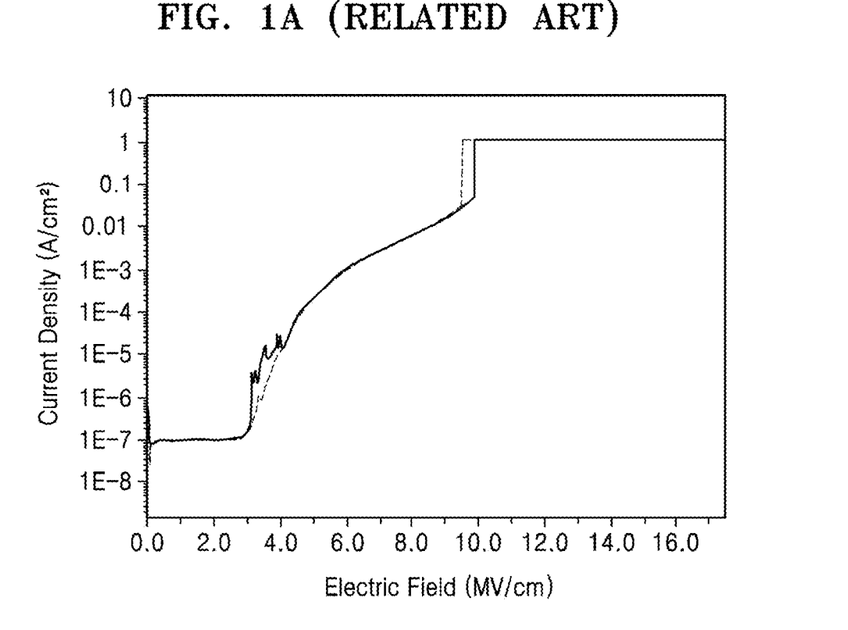
FIG. 1A shows Current Density vs. Electric Field curves each illustrating a relationship between a current density and an electric field obtained by measuring an $Al_2O_3$ thin film that is deposited on a silicon (Si) substrate.
Figure 1B:
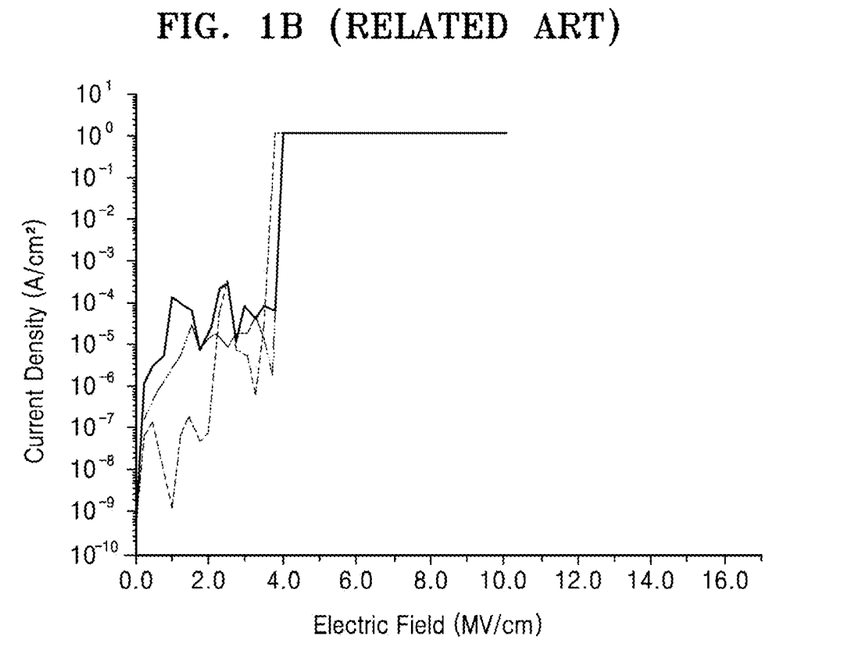
FIG. 1B shows Current Density vs. Electric Field curves each illustrating a relationship between a current density and an electric field obtained by measuring an $Al_2O_3$ thin film that is deposited on an indium tin oxide (ITO) substrate.

FIG. 1A shows Current Density vs. Electric Field curves each illustrating a relationship between a current density and an electric field obtained by measuring an $Al_2O_3$ thin film that is deposited on a silicon (Si) thin film. FIG. 1B shows Current Density vs. Electric Field curves each illustrating a relationship between a current density and an electric field obtained by measuring an $Al_2O_3$ thin film that is deposited on an indium tin oxide (ITO) substrate. FIGS. 1A and 1B illustrate each two experimental results obtained after measuring a transistor device that uses an $Al_2O_3$ thin film as a gate insulating layer. The $Al_2O_3$ thin film is deposited to a thickness of about 20 nm at a temperature of about 150° C. by using atomic layer deposition (ALD).

Referring to FIGS. 1A and 1B, the $Al_2O_3$ thin film that is deposited on the Si substrate has a breakdown voltage ranging from about 9.0 MV/cm to about 9.5 MV/cm, whereas the $Al_2O_3$ thin film that is deposited on the ITO substrate has a breakdown voltage ranging from about 3.0 MV/cm to about 3.5 MV/cm, which is much lower than the breakdown voltage ranging from about 9.0 MV/cm to about 9.5 MV/cm. Since the $Al_2O_3$ thin film that is deposited on the ITO substrate has a lower breakdown voltage, it is difficult to use an $Al_2O_3$ thin film that is deposited on the ITO substrate in an electronic device such as a logic device.

Figure 2A:
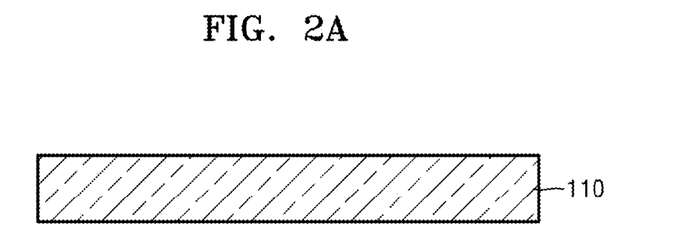
FIGS. 2A through 2C are cross-sectional views for explaining a method of forming an oxide thin film, according to at least one example embodiment.
Figure 2B:
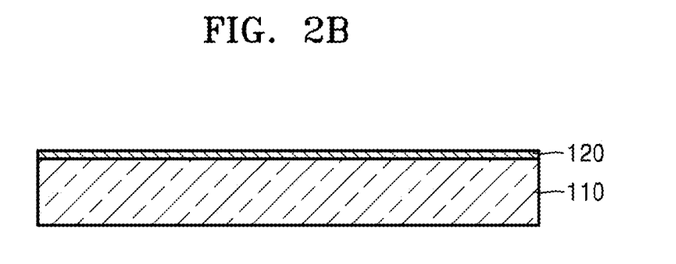
Figure 2C:
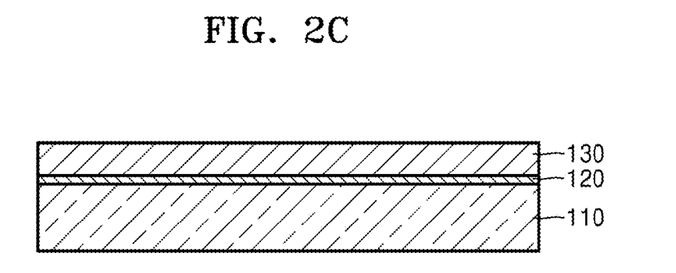

FIGS. 2A through 2C are cross-sectional views for explaining a method of forming an oxide thin film, according to an example embodiment.

Referring to FIG. 2A, a substrate 110 is prepared. The substrate 110 may include a transparent conductive inorganic material. For example, the substrate 110 may include ITO, indium zinc oxide (IZO), antimony tin oxide (ATO), aluminum (Al)-doped zinc oxide (AZO), or zinc tin oxide (ZTO). However, the example embodiment is not limited thereto, and the substrate 110 may include any of various other materials.

Referring to FIG. 2B, according to at least one example embodiment, a metal seed layer 120 is deposited at a desired (or alternatively predetermined) thickness on a top surface of the substrate 110. The metal seed layer 120 may include at least one of Al, titanium (Ti), chromium (Cr), iron (Fe), cobalt (Co), nickel (Ni), copper (Cu), zinc (Zn), palladium (Pd), platinum (Pt), gold (Au), and silver (Ag). A thickness of the metal seed layer 120 may be equal to or less than about 5 nanometers (nm) in order to ensure transparency. However, the example embodiment is not limited thereto, and a thickness of the metal seed layer 120 may be changed in various ways. The metal seed layer 120 may be deposited on the top surface of the substrate 110 by using, but not limited to, physical vapor deposition (PVD) including e-beam evaporation, chemical vapor deposition (CVD), or atomic layer deposition (ALD).

The metal seed layer 120 may be uniformly deposited on a surface of the substrate 110 without a change in a surface roughness of the metal seed layer 120 with respect to the surface roughness of the substrate 110. For example, when a Ni seed layer is deposited at a thickness of about 3 nm by using e-beam evaporation on a surface of an ITO substrate having a root mean square (RMS) surface roughness of 1.51 nm, the measured RMS surface roughness of the deposited Ni seed layer is about 1.56 nm. When an Al seed layer is deposited at a thickness of about 3 nm by using e-beam evaporation on a surface of an ITO substrate having an RMS surface roughness of 1.51 nm, the measured RMS surface roughness of the deposited Al seed layer is about 1.55 nm. Also, when a Pt seed layer is deposited at a thickness of about 3 nm by using e-beam evaporation on a surface of an ITO substrate having an RMS surface roughness of 1.51 nm, the measured RMS surface roughness of the deposited Pt seed layer is about 1.91 nm. Accordingly, even when a metal seed layer is deposited on a surface of a transparent conductive substrate, such as an ITO substrate, a surface roughness is hardly changed between the metal seed layer 120 and the substrate 110, and the metal seed layer is uniformly deposited.

Referring to FIG. 2C, a metal oxide layer 130 is deposited at a desired (or alternatively predetermined) thickness on a top surface of the metal seed layer 120. The metal oxide layer 130 may include, for example, $B_2O_3$, $B_xP_yO_z$, $Al_2O_3$, $Al_xSi_yO_z$, $Al_xCr_yO_z$, $SiO_2$, $Si_xAl_yO_z$, $Si_xTi_yO_z$, $PO_x$, $TiO_2$, $Ti_xSi_yO_z$, $VO_x$, $CrO_x$, $Cr_xAl_yO_z$, $FeO_x$, $ZnO$, $GeO_2$, $SnO_2$, $Ta_2O_5$, $CoO_x$, $CuO$, $NiO$, $Ga_2O_3$, $SrO$, $Y_2O_3$, $ZrO_2$, $Zr_xAl_yO_z$, $Zr_xTi_yO_z$, $Nb_2O_5$, $RuO$, $In_2O_3$, $Sb_2O_4$, $La_2O_3$, $CeO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, $HfO_2$, $Hf_xAl_yO_z$, $Hf_xSi_yO_z$, $Hf_xTi_yO_z$, $WO_3$, or $BiO_x$. Subscripts x, y, and z that are included in three-component materials from among the above materials satisfy $0<x<1$, $0<y<1$, and $z=1-x-y$. The example embodiment is not limited thereto, and the metal oxide layer 130 may include any of various other materials. The metal oxide layer 130 may be uniformly deposited at a constant thickness on the top surface of the metal seed layer 120. The metal oxide layer 130 may be formed by using, for example, ALD. The metal oxide layer 130 may be formed at a temperature ranging from, but not limited to, about 15° C. to about 1500° C. When the metal oxide layer 130 is formed by using ALD, the metal seed layer 120 may be relatively thinly deposited to a thickness of about several tens of nm. The metal oxide layer 130 may be formed by using a deposition method other than ALD. For example, the metal oxide layer 130 may be formed by using PVD or CVD. The metal seed layer 120 and the metal oxide layer 130 may be sequentially deposited on the substrate 110 that includes the transparent conductive inorganic material, thereby completing a thin film structure. The thin film structure including the metal seed layer 120 may be applied to any of various electronic devices including a logic device.

According to at least one example embodiment, the metal seed layer 120 is deposited on the substrate 110 that includes the transparent conductive inorganic material, and the metal oxide layer 130 is formed on the metal seed layer 120. The metal oxide layer 130 that is deposited on the metal seed layer 120 may have a breakdown voltage that is about two times greater than a breakdown voltage of a metal oxide layer that is directly deposited on the substrate 110 that includes the transparent conductive inorganic material. Since the thin film structure including the metal oxide layer 130 on the metal seed layer 120 may have appropriate breakdown voltage characteristics, the thin film structure may be applied to any of various electronic devices such as a logic device.

Figure 3A:
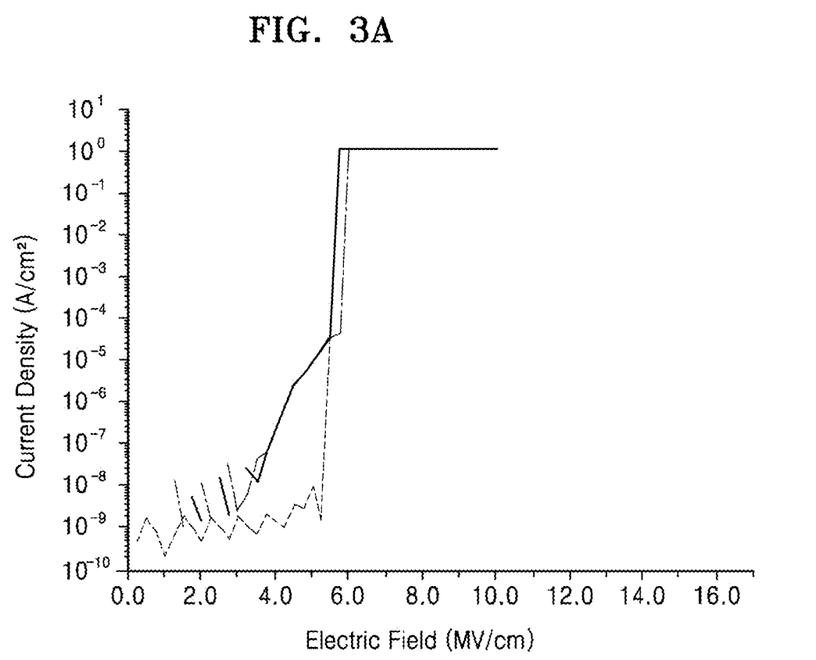
FIG. 3A shows Current Density vs. Electric Field curves each illustrating a relationship between a current density and an electric field obtained by measuring an $Al_2O_3$ thin film that is deposited on an aluminum (Al) seed layer, according to at least one example embodiment.
Figure 3B:
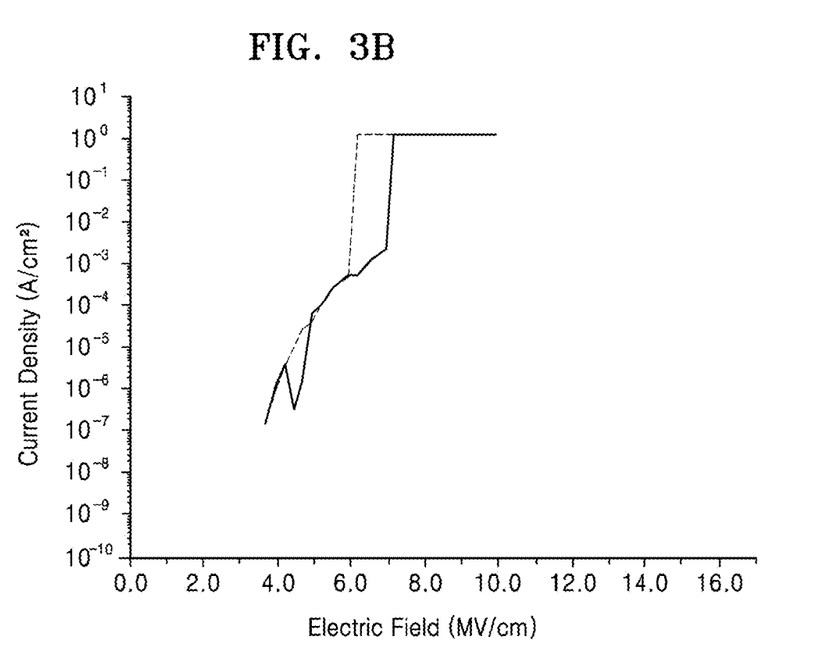
FIG. 3B shows Current Density vs. Electric Field curves each illustrating a relationship between a current density and an electric field obtained by measuring an $Al_2O_3$ thin film that is deposited on a nickel (Ni) seed layer, according to at least one example embodiment.
Figure 3C:
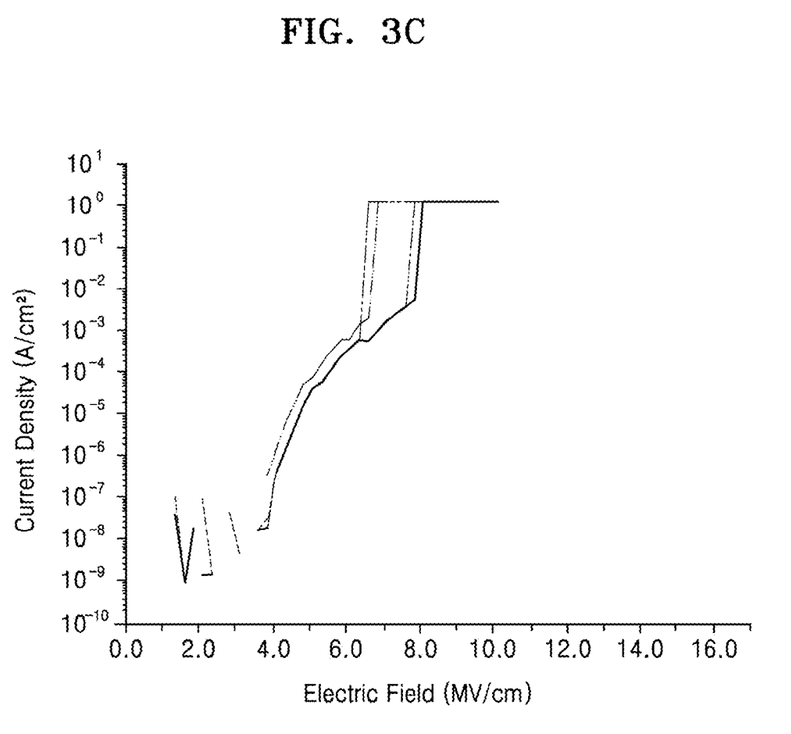
FIG. 3C shows Current Density vs. Electric Field curves each illustrating a relationship between a current density and an electric field obtained by measuring an $Al_2O_3$ thin film that is deposited on a platinum (Pt) seed layer, according to at least one example embodiment.

FIG. 3A shows Current Density vs. Electric Field curves each illustrating a relationship between a current density and an electric field obtained by measuring an $Al_2O_3$ thin film that is deposited on an Al seed layer of an ITO substrate, according to at least one example embodiment. FIG. 3B shows Current Density vs. Electric Field curves each illustrating a relationship between a current density and an electric field obtained by measuring an $Al_2O_3$ thin film that is deposited on a Ni seed layer of an ITO substrate, according to at least one example embodiment. FIG. 3C shows Current Density vs. Electric Field curves each illustrating a relationship between a current density and an electric field obtained by measuring an $Al_2O_3$ thin film that is deposited on a Pt seed layer of an ITO substrate. FIGS. 3A, 3B, and 3C illustrate each two experimental results obtained after measuring a transistor device that uses an $Al_2O_3$ thin film as a gate insulating layer. The $Al_2O_3$ thin film is deposited at a thickness of about 20 nm at a temperature of about 150° C. by using ALD.

Referring to FIGS. 3A through 3C, the $Al_2O_3$ thin film that is deposited on the Al seed layer of the ITO substrate has a breakdown voltage ranging from about 5.5 MV/cm to about 6.5 MV/cm, the $Al_2O_3$ thin film deposited on the Ni seed layer of the ITO substrate has a breakdown voltage ranging from about 6.0 MV/cm to about 7.0 MV/cm, and the $Al_2O_3$ thin film deposited on the Pt seed layer of the ITO substrate has a breakdown voltage ranging from about 6.7 MV/cm to about 7.5 MV/cm. Accordingly, when a metal seed layer is deposited on a transparent conductive substrate and a metal oxide layer is formed on the metal seed layer, the metal oxide layer that is deposited on the metal seed layer has a breakdown voltage that is about 2 times greater than a breakdown voltage of a metal oxide layer that is directly deposited on a transparent conductive substrate. As such, the metal oxide layer that is deposited on the metal seed layer of the transparent conductive substrate may have breakdown voltage characteristics that are satisfactory for an electronic device such as a logic device.

Figure 4A:
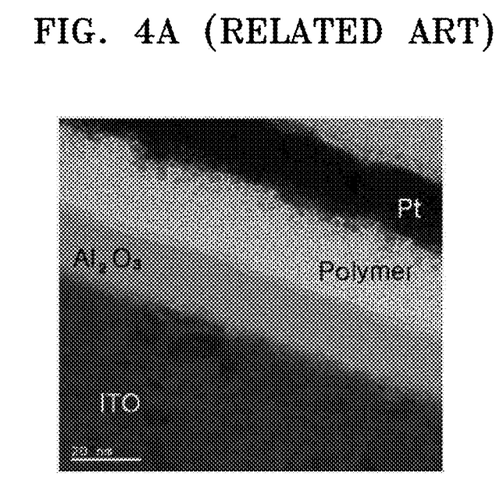
FIG. 4A is a transmission electron microscopy (TEM) image illustrating a cross-section of an $Al_2O_3$ thin film that is deposited on an ITO substrate.
Figure 4B:
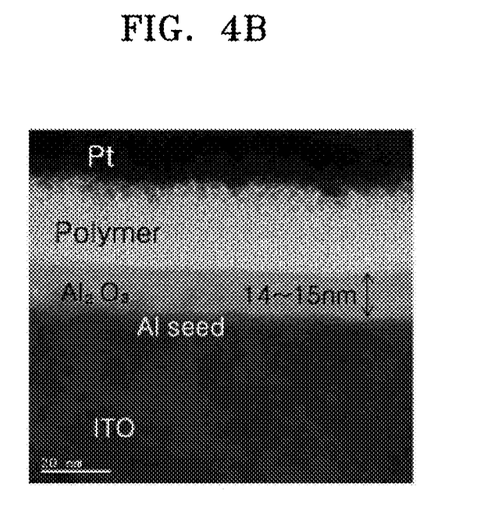
FIG. 4B is a TEM image illustrating a cross-section of an Al seed layer and an $Al_2O_3$ thin film that are sequentially deposited on an ITO substrate, according to at least one example embodiment.
Figure 4C:
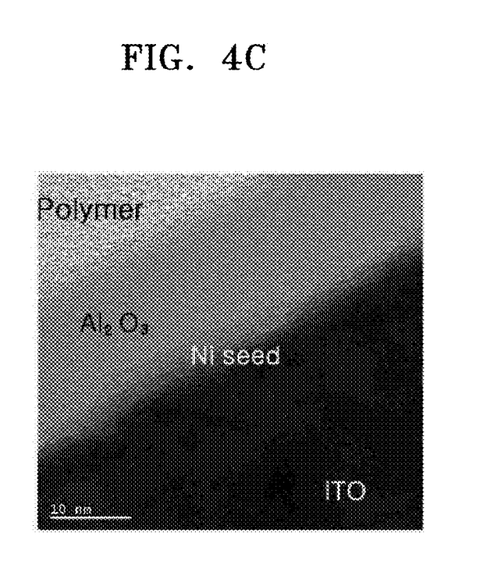
FIG. 4C is a TEM image illustrating a cross-section of a Ni seed layer and an $Al_2O_3$ thin film that are sequentially deposited on an ITO substrate, according to at least one example embodiment.
Figure 4D:
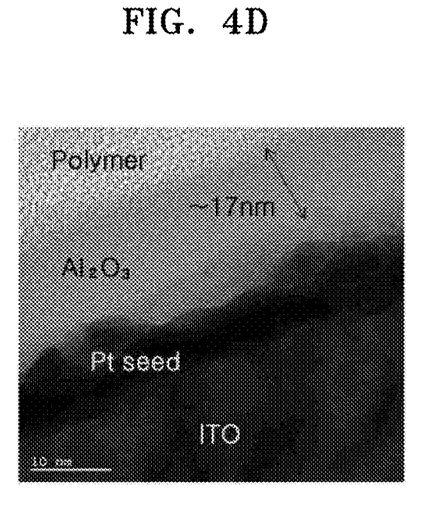
FIG. 4D is a TEM image illustrating a cross-section of a Pt seed layer and an $Al_2O_3$ thin film that are sequentially deposited on an ITO substrate, according to at least one example embodiment.

FIG. 4A is a transmission electron microscopy (TEM) image illustrating a cross-section of an $Al_2O_3$ thin film that is deposited on an ITO substrate. FIG. 4B is a TEM image illustrating a cross-section of an Al seed layer and an $Al_2O_3$ thin film that are sequentially deposited on an ITO substrate, according to at least one example embodiment. FIG. 4C is a TEM image illustrating a cross-section of a Ni seed layer and an $Al_2O_3$ thin film that are sequentially deposited on an ITO substrate, according to at least one example embodiment. FIG. 4D is a TEM image illustrating a cross-section of a Pt seed layer and an $Al_2O_3$ thin film that are sequentially deposited on an ITO substrate, according to at least one example embodiment. Referring to FIGS. 4B through 4D, the Al seed layer, the Ni seed layer, and the Pt seed layer that are metal seed layers are uniformly deposited on surfaces of the ITO substrates, and the $Al_2O_3$ thin films that are metal oxide layers are uniformly deposited on surfaces of the Al seed layer, the Ni seed layer, and the Pt seed layer.

Figure 5:
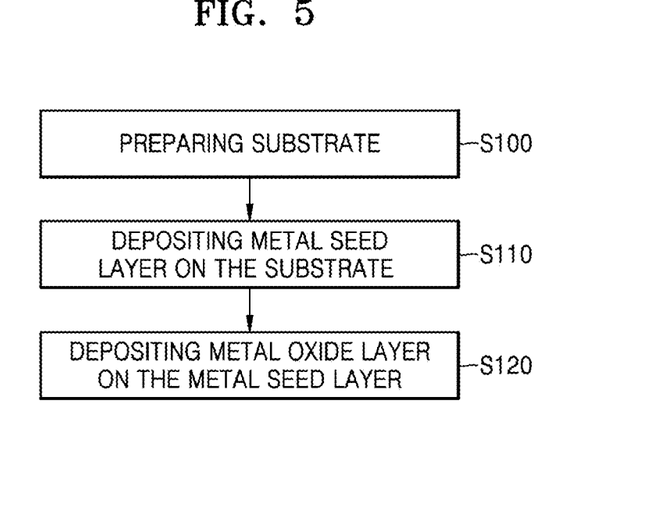
FIG. 5 is a flow chart illustrating a method of forming an oxide thin film structure, according to at least one example embodiment.

FIG. 5 is a flow chart illustrating a method of forming an oxide thin film structure, according to at least one example embodiment. In FIG. 5, the method starts at S100, where a substrate is prepared. For example, the substrate may include ITO, indium zinc oxide (IZO), antimony tin oxide (ATO), aluminum (Al)-doped zinc oxide (AZO), or zinc tin oxide (ZTO). At S110, a metal seed layer 120 is deposited at a desired thickness on a top surface of the substrate. For example, the metal seed layer includes at least one of Al, titanium (Ti), chromium (Cr), iron (Fe), cobalt (Co), nickel (Ni), copper (Cu), zinc (Zn), palladium (Pd), platinum (Pt), gold (Au), and silver (Ag). At S120, a metal oxide layer is deposited at a desired thickness on a top surface of the metal seed layer. For example, the metal oxide layer includes at least one of $B_2O_3$, $B_xP_yO_z$, $Al_2O_3$, $Al_xSi_yO_z$, $Al_xCr_yO_z$, $SiO_2$, $Si_xAl_yO_z$, $Si_xTi_yO_z$, $PO_x$, $TiO_2$, $Ti_xSi_yO_z$, $VO_x$, $CrO_x$, $Cr_xAl_yO_z$, $FeO_x$, $ZnO$, $GeO_2$, $SnO_2$, $Ta_2O_5$, $CoO_x$, $CuO$, $NiO$, $Ga_2O_3$, $SrO$, $Y_2O_3$, $ZrO_2$, $Zr_xAl_yO_z$, $Zr_xTi_yO_z$, $Nb_2O_5$, $RuO$, $In_2O_3$, $Sb_2O_4$, $La_2O_3$, $CeO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, $HfO_2$, $Hf_xAl_yO_z$, $Hf_xSi_yO_z$, $Hf_xTi_yO_z$, $WO_3$, or $BiO_x$. Subscripts x, y, and z that are included in three-component materials from among the above materials satisfy $0<x<1$, $0<y<1$, and $z=1-x-y$.

According to the one or more example embodiments, a metal seed layer is deposited on a transparent conductive substrate, and a metal oxide layer is formed on the metal seed layer. As such, the metal oxide layer that is deposited on the metal seed layer may have a breakdown voltage that is greater than the breakdown voltage of a metal oxide layer that is directly deposited on a transparent conductive substrate. Accordingly, the metal seed layer that is deposited on the transparent conductive substrate and a thin film structure including a metal oxide may have appropriate breakdown voltage characteristics, and thus may be applied to any of various electronic devices including a logic device. While one or more example embodiments have been described with reference to the figures, it will be understood by those of ordinary skill in the art that various changes in form and details may be made therein without departing from the spirit and scope of the example embodiments as defined by the following claims.

What is claimed is:

1. A thin film structure comprising:
   a substrate including a transparent conductive material;
   a metal seed layer directly on the substrate, the metal seed layer being a single phase layer; and
   a metal oxide layer directly on the metal seed layer, a breakdown voltage of the metal oxide layer being higher than a breakdown voltage of the metal oxide layer when no metal seed layer is on the substrate;
   wherein the substrate is a single phase substrate, the substrate and the metal oxide layer not including a common metal; and
   wherein the substrate includes at least one of indium tin oxide (ITO), indium zinc oxide (IZO), antimony tin oxide (ATO), aluminum (Al)-doped zinc oxide (AZO), and zinc tin oxide (ZTO).

2. The thin film structure of claim 1, wherein the metal seed layer comprises at least one of aluminum (Al), titanium (Ti), chromium (Cr), iron (Fe), cobalt (Co), nickel (Ni), copper (Cu), zinc (Zn), palladium (Pd), platinum (Pt), gold (Au), and silver (Ag).

3. The thin film structure of claim 1, wherein a thickness of the metal seed layer is equal to or less than 5 nm.

4. The thin film structure of claim 1, wherein the metal oxide layer comprises at least one of $B_2O_3$, $B_xP_yO_z$, $Al_2O_3$, $Al_xSi_yO_z$, $Al_xCr_yO_z$, $SiO_2$, $Si_xAl_yO_z$, $Si_xTi_yO_z$, $PO_x$, $TiO_2$, $Ti_xSi_yO_z$, $VO_x$, $CrO_x$, $Cr_xAl_yO_z$, $FeO_x$, $ZnO$, $GeO_2$, $SnO_2$, $Ta_2O_5$, $CoO_x$, $CuO$, $NiO$, $Ga_2O_3$, $SrO$, $Y_2O_3$, $ZrO_2$, $Zr_xAl_yO_z$, $Zr_xTi_yO_z$, $Nb_2O_5$, $RuO$, $In_2O_3$, $Sb_2O_4$, $La_2O_3$, $CeO_2$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, $HfO_2$, $Hf_xAl_yO_z$, $Hf_xSi_yO_z$, $Hf_xTi_yO_z$, $WO_3$, and $BiO_x$, wherein $0<x<1$, $0<y<1$ and $z=1-x-y$.

5. The thin film structure of claim 1, wherein the metal oxide layer is deposited via at least one of atomic layer deposition (ALD), chemical vapor deposition (CVD), and physical vapor deposition (PVD).

6. A method of forming an oxide thin film, the method comprising:
   preparing a substrate including a transparent conductive inorganic material;
   depositing a metal seed layer directly on the substrate, the metal seed layer being a single phase layer; and
   depositing a metal oxide layer directly on the metal seed layer, a breakdown voltage of the metal oxide layer being higher than a breakdown voltage of the metal oxide layer when no metal seed layer is on the substrate;
   wherein the substrate is a single phase substrate, the substrate and the metal oxide layer not including a common metal; and
   wherein the substrate includes at least one of indium tin oxide (ITO), indium zinc oxide (IZO), antimony tin oxide (ATO), aluminum (Al)-doped zinc oxide (AZO), and zinc tin oxide (ZTO).

7. The method of claim 6, wherein the metal seed layer comprises at least one of aluminum (Al), titanium (Ti), chromium (Cr), iron (Fe), cobalt (Co), nickel (Ni), copper (Cu), zinc (Zn), palladium (Pd), platinum (Pt), gold (Au), and silver (Ag).

8. The method of claim 6, wherein the metal seed layer is formed to a thickness that is equal to or less than 5 nm.

9. The method of claim 6, wherein the metal seed layer is deposited by using at least one of physical vapor deposition (PVD), chemical vapor deposition (CVD), and atomic layer deposition (ALD).

10. The method of claim 6, wherein the metal oxide layer is deposited by using ALD.

11. The method of claim 10, wherein the metal oxide layer is formed to a thickness that is equal to or less than several tens of nm.

12. The method of claim 10, wherein the metal oxide layer is formed at a temperature ranging from about 15° C. to about 1500° C.

13. The method of claim 6, wherein the metal oxide layer is formed by using PVD or CVD.

* * * * *